(12) United States Patent
Qi

(10) Patent No.: US 11,268,184 B2
(45) Date of Patent: Mar. 8, 2022

(54) MASK FRAME ASSEMBLY

(71) Applicants: ORDOS YUANSHENG OPTOELECTRONICS CO., LTD., Inner Mongolia (CN); BOE TECHNOLOGY GROUP CO., LTD., Beijing (CN)

(72) Inventor: Haiping Qi, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/621,964

(22) PCT Filed: Aug. 8, 2019

(86) PCT No.: PCT/CN2019/099795
§ 371 (c)(1),
(2) Date: Dec. 12, 2019

(87) PCT Pub. No.: WO2020/034892
PCT Pub. Date: Feb. 20, 2020

(65) Prior Publication Data
US 2021/0332470 A1  Oct. 28, 2021

(30) Foreign Application Priority Data
Aug. 17, 2018 (CN) .......................... 201810941863.7

(51) Int. Cl.
*C23C 14/04* (2006.01)
*C23C 14/24* (2006.01)
*B05C 21/00* (2006.01)

(52) U.S. Cl.
CPC .......... *C23C 14/042* (2013.01); *B05C 21/005* (2013.01); *C23C 14/24* (2013.01)

(58) Field of Classification Search
CPC ................................................... C23C 14/042
See application file for complete search history.

(56) References Cited

U.S. PATENT DOCUMENTS

| 9,673,424 | B2 | 6/2017 | Han |
| 2010/0080915 | A1 | 4/2010 | Masuda et al. |
| 2018/0196343 | A1* | 7/2018 | Ji .............................. G03F 1/64 |

FOREIGN PATENT DOCUMENTS

| CN | 103205670 A | 7/2013 |
| CN | 204434718 U | 7/2015 |

(Continued)

OTHER PUBLICATIONS

International Search Report dated Nov. 4, 2019, issued in counterpart Application No. PCT/CN2019/099795 (12 pages).

(Continued)

*Primary Examiner* — Keath T Chen
(74) *Attorney, Agent, or Firm* — Westerman, Hattori, Daniels & Adrian, LLP

(57) ABSTRACT

The present disclosure generally relates to display technologies, and in particular, to a mask frame assembly that is suitable for use in the production of a display device, for example, an organismic light emitting diode (OLED) device. A mask frame assembly includes a frame, and an alignment mask secured to the frame. The frame includes at least one alignment mark and a cover plate on the at least one at least one alignment mark. The cover plate includes a first through-hole and a plurality of first auxiliary through-holes. The alignment mask includes at least one second through-hole and a plurality of second auxiliary through-holes.

18 Claims, 12 Drawing Sheets

(56) References Cited

FOREIGN PATENT DOCUMENTS

| | | | | |
|---|---|---|---|---|
| CN | 105549320 A | | 5/2016 | |
| CN | 201610320002.8 | * | 5/2016 | ........... C23C 14/042 |
| CN | 105887010 A | | 8/2016 | |
| CN | 206033864 U | | 3/2017 | |
| CN | 106676469 A | | 5/2017 | |
| CN | 107256839 A | | 10/2017 | |
| CN | 107653436 A | | 2/2018 | |
| CN | 108611600 A | | 10/2018 | |
| EP | 1707648 A2 | | 10/2006 | |
| KR | 20060065128 | * | 6/2006 | ......... H01L 51/0012 |
| WO | 9627689 A1 | | 9/1996 | |

OTHER PUBLICATIONS

Office Action dated Oct. 21, 2019, issued in counterpart CN Application No. 201810941863.7, with English translation (11 pages).

\* cited by examiner

MASK FRAME ASSEMBLY

CROSS-REFERENCE TO RELATED APPLICATIONS

This application claims benefit of the filing date of Chinese Patent Application No. 201810941863.7 filed on Aug. 17, 2018, the disclosure of which is hereby incorporated in its entirety by reference.

TECHNICAL FIELD

The present disclosure generally relates to display technologies, and in particular, to a mask frame assembly that is suitable for use in the production of a display device, for example, an organismic light emitting diode (OLED) device.

BACKGROUND

Currently, the display technologies mainly include two main categories: organic light emitting diode (OLED) technology and liquid crystal display (LCD) technology. OLED is an organic thin film electroluminescent display device, and has numerous advantages that contribute to their popularity in the field of display technology. For example, OLED devices are self-illuminating, and are capable of high luminance, high contrast, simple construction, low power consumption and high energy efficiency, wide viewing angles, flexible display, and three-dimensional (3D) display. These advantages combine to make OLED a focus in the developments of display technologies.

BRIEF SUMMARY

The present disclosure provides a mask frame assembly. The mask frame assembly may comprise a frame, and an alignment mask secured to the frame. In at least some embodiments, the frame may comprise at least one alignment mark and a cover plate on the at least one at least one alignment mark. In at least some embodiments, the cover plate may comprise a first through-hole and a plurality of first auxiliary through-holes, the first through-hole and the plurality of first auxiliary through-holes defining a first via hole area, and the first through-hole overlapping with the at least one alignment mark. In at least some embodiments, the alignment mask may comprise at least one second through-hole and a plurality of second auxiliary through-holes, the at least one second through-hole and the plurality of second auxiliary through-holes defining a second via hole area, the at least one second through-hole being aligned with the at least one first through-hole.

In at least some embodiments, the first via hole area may overlap with the second via hole area. In at least some embodiments, the plurality of first auxiliary through-holes and the plurality of second auxiliary through-holes may be staggered relative to each other.

In at least some embodiments, the plurality of first auxiliary through-holes may not overlap entirely with any of the plurality of second auxiliary through-holes.

In at least some embodiments, the plurality of first auxiliary through-holes may not overlap with any of the plurality of second auxiliary through-holes.

In at least some embodiments, the first through-hole and second through-hole may be off-center relative to a center of the alignment mark.

In at least some embodiments, the at least one alignment mark may be formed with a stepped edge, and the cover plate may be anchored against the stepped edge, so that a surface of the cover plate is flush with a surface of the frame facing the alignment mask.

In at least some embodiments, the at least one alignment mark may be a blind hole.

In at least some embodiments, a diameter of an opening of the first through-hole may be from 0.5 mm to 0.7 mm. In at least some embodiments, a diameter of an opening of the second through-hole may be from 0.4 mm to 0.6 mm.

In at least some embodiments, a diameter of an opening of the first through-hole may be either larger or the same as a diameter of an opening of the second through-hole.

In at least some embodiments, an orthographic projection of the second through-hole onto an imaginary plane parallel to a surface of the frame facing the alignment mask may be completely within an orthographic projection of the first through-hole onto the imaginary plane.

In at least some embodiments, the first through-hole may be larger than any of the plurality of first auxiliary through-holes. In at least some embodiments, the second through-hole may be larger than any of the plurality of second auxiliary through-holes.

In at least some embodiments, a diameter of an opening of each of the plurality of first auxiliary through-holes and the plurality of second auxiliary through-holes may be from 0.1 mm to 0.5 mm.

In at least some embodiments, the plurality of first auxiliary through-holes may be either larger or of the same size as the plurality of second auxiliary through-holes.

In at least some embodiments, the plurality of first auxiliary through-holes may be larger than the plurality of second auxiliary through-holes. In at least some embodiments, the diameter of the opening of each of the plurality of first auxiliary through-holes may be 1.2 to 3.0 times the diameter of the opening of each of the plurality of second auxiliary through-holes.

In at least some embodiments, a distance between the first through-hole and a nearest first auxiliary through-hole may be from 0.1 mm to 0.25 mm. In at least some embodiments, a distance between the second through-hole and a nearest second auxiliary through-hole may be from 0.1 mm to 0.25 mm.

In at least some embodiments, none of the plurality of first auxiliary through-holes may be provided within 0.1 mm to 0.25 mm of the first through-hole.

In at least some embodiments, none of the plurality of second auxiliary through-holes may be provided within 0.1 mm to 0.25 mm of the second through-hole.

In at least some embodiments, the cover plate may have a thickness of from 10 μm to 50 μm.

In at least some embodiments, the alignment mask may be a rectangular strip, and the at least one second through-hole may be provided at a longitudinal end of the rectangular strip.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the present disclosure are apparent from the following detailed description taken in conjunction with the accompanying drawings in which:

Figure 1:
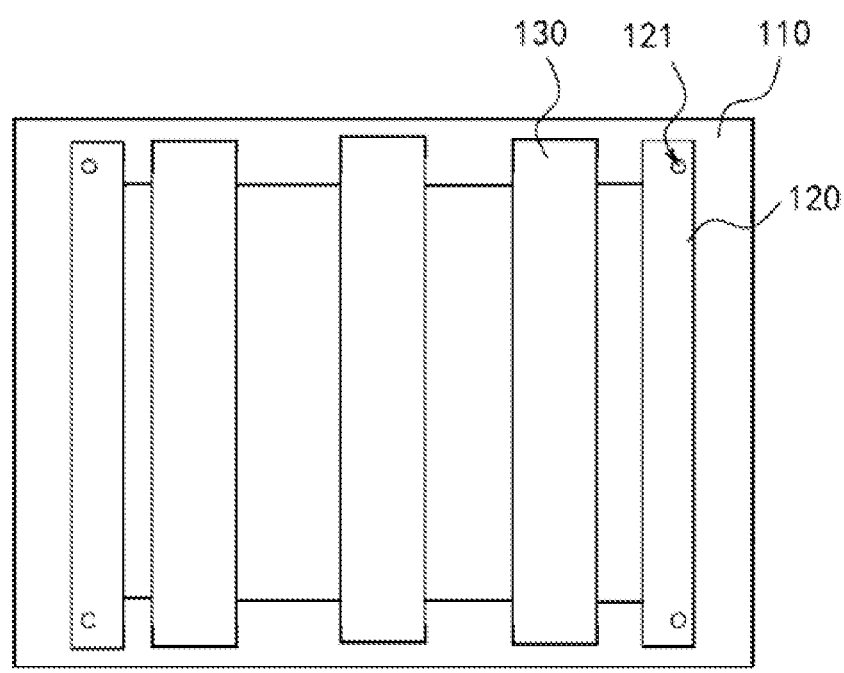
FIG. 1 shows a schematic diagram of a conventional mask frame assembly.

The various features of the drawings are not to scale as the illustrations are for clarity in facilitating one skilled in the art in understanding the invention in conjunction with the detailed description.

DETAILED DESCRIPTION

Next, the embodiments of the present disclosure will be described clearly and concretely in conjunction with the accompanying drawings, which are described briefly above. The subject matter of the present disclosure is described with specificity to meet statutory requirements. However, the description itself is not intended to limit the scope of this disclosure. Rather, the inventors contemplate that the claimed subject matter might also be embodied in other ways, to include different steps or elements similar to the ones described in this document, in conjunction with other present or future technologies.

While the present technology has been described in connection with the embodiments of the various figures, it is to be understood that other similar embodiments may be used or modifications and additions may be made to the described embodiments for performing the same function of the present technology without deviating therefrom. Therefore, the present technology should not be limited to any single embodiment, but rather should be construed in breadth and scope in accordance with the appended claims. In addition, all other embodiments obtained by one of ordinary skill in the art based on embodiments described in this document are considered to be within the scope of this disclosure.

Currently, the display technologies mainly include two main categories: organic light emitting diode (OLED) technology and liquid crystal display (LCD) technology. OLED is an organic thin film electroluminescent display device, and has numerous advantages that contribute to their popularity in the field of display technology. For example, OLED devices are self-illuminating, and are capable of high luminance, high contrast, simple construction, low power consumption and high energy efficiency, wide viewing angles, flexible display, and three-dimensional (3D) display. These advantages combine to make OLED a focus in the developments of display technologies.

An OLED device generally includes sub-pixel units that are arranged in an array. Each sub-pixel unit comprises an anode, a light emitting layer, and a cathode. OLED devices are usually produced using an evaporation process, whereby OLED materials are evaporated and then deposited onto a substrate. The set-up for the evaporation process includes a mask frame assembly. The mask frame assembly includes a mask plate soldered onto a mask frame. A crucial consideration during the evaporation process is the alignment of the mask plate. The mask plate defines the opening of the sub-pixel unit. The precision of alignment between the mask plate (and the opening of the sub-pixel unit) and the pixel electrodes that are formed on the substrate can determine the quality of the resulting product. For example, a large misalignment between the mask plate and the pixel electrodes can cause color bleeding, which affects the quality of the display on the OLED device.

FIG. 1 shows a schematic diagram of a conventional mask frame assembly. The mask frame assembly includes a mask frame 110 and an alignment mask 120. Alignment marks are provided on the four corners of the mask frame 110. Alignment holes 121 are formed in the alignment mask at positions corresponding to the alignment marks on the mask frame 110. During alignment, images are acquired by a couple-charged device (CCD) image sensor and processed to align the substrate and the metal mask plate 130. However, the alignment marks on the mask frame 110 usually have a conical shape. Further, the dimensions of the alignment holes 121 on the alignment mask 120 are usually far smaller than the dimensions of the alignment holes 121 on the mask frame 110. As a result of these configurations, after the mask frame 110 of the mask frame assembly is cleaned, liquids used during the manufacturing process often remain in the conical bores of the mask frame 110. These liquids are difficult to remove by evaporation or by blowing with an air knife. During conveyance or use of the mask plate in production, the residual liquids may flow out of conical bores and form spots or smudges around the alignment holes 121 on the alignment mask 120. These contaminations may prevent the image sensor for clearly and precisely recognizing the alignment marks, which may in turn interfere with or prevent altogether the proper alignment of the mask frame assembly with the underlying substrate. This can result in inferior products.

Further, the alignment mask 120 is often formed of a ferromagnetic material. The alignment mask 120 is magnetically adsorbed when exposed to a magnetic field. The conditions of adsorption to a magnetic separator differ each time, resulting in a different offset each time. During alignment in an evaporation apparatus, the variations in offsets often necessitate repeated alignment and re-alignment. This lowers productivity and efficiency. At the same time, heating of the alignment mask 120 during the evaporation process also produces offsets in the alignment holes 121.

Figure 2:
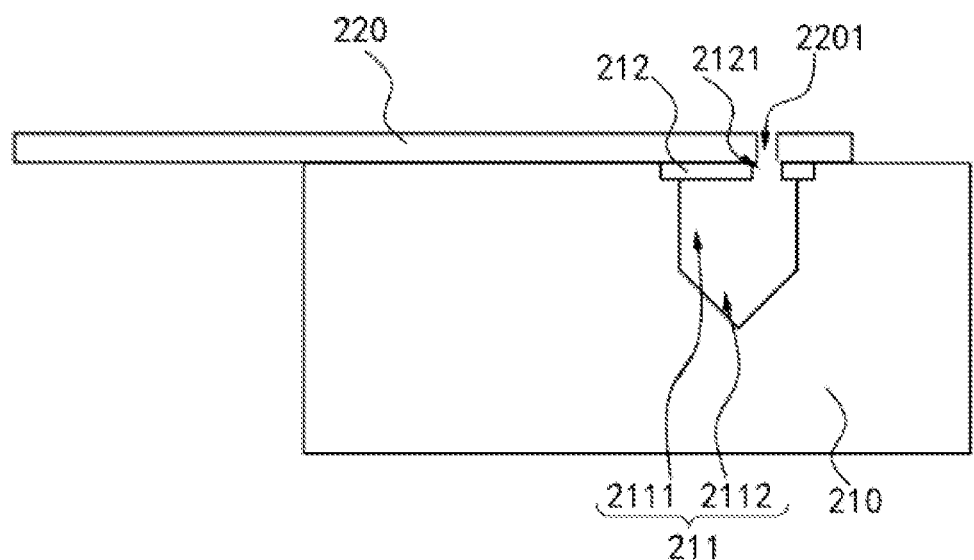
FIG. 2 shows schematically a cross-sectional view of a mask frame assembly according to an embodiment of the present disclosure.

FIG. 2 shows a schematic diagram of a mask frame assembly according to an embodiment of the present disclosure, and in particular, a cross-sectional view of the mask frame assembly.

The present disclosure describes the mask frame assembly in the context of an evaporation process for producing an OLED device, but this description is only used to help understand the embodiments of the present disclosure and the core idea thereof. It is understood that the features of the embodiments of the present disclosure may be applied to an evaporation process for producing other types of display devices or other semiconductor devices without departing from the scope and spirit of the present disclosure. A person of ordinary skill in the art can make various modifications to the present disclosure without departing from the scope and spirit of the present disclosure.

As shown in FIG. 2, the mask frame assembly includes a mask frame 210, a metal mask plate, and an alignment mask 220. The metal mask plate and the alignment mask 220 are provided on the surface of the mask frame 210. The alignment mask 220 is secured to the four corners of the mask frame 210. The metal mask plate may be designed, constructed, and configured in any appropriate manner known to a person of ordinary skill in the art, including, but not limited to, a fine metal mask plate. The design, construction, and configuration of the metal mask plate are not particularly limited.

Figure 3:
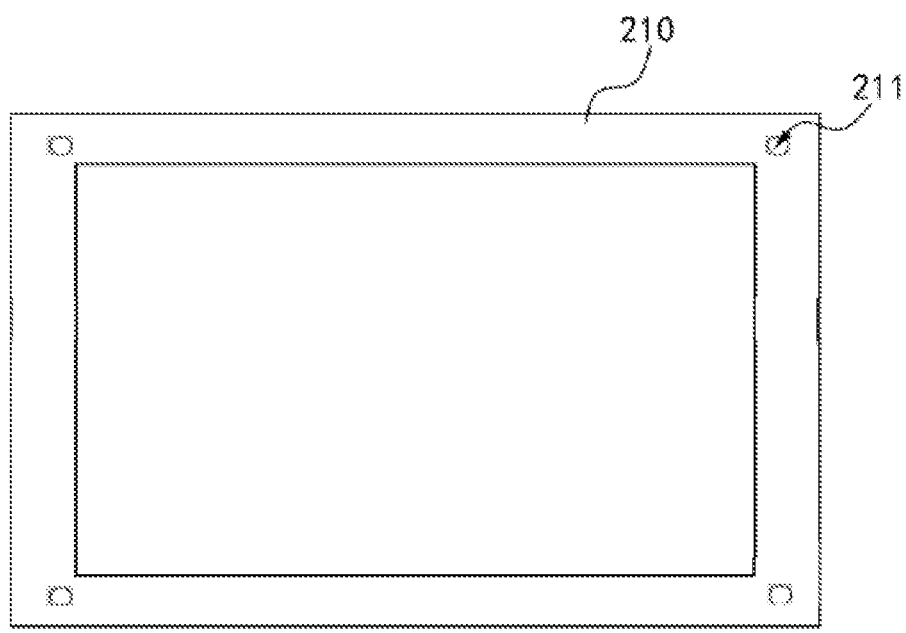
FIG. 3 shows schematically a top view of the mask frame in the mask frame assembly illustrated in FIG. 2.
Figure 4:
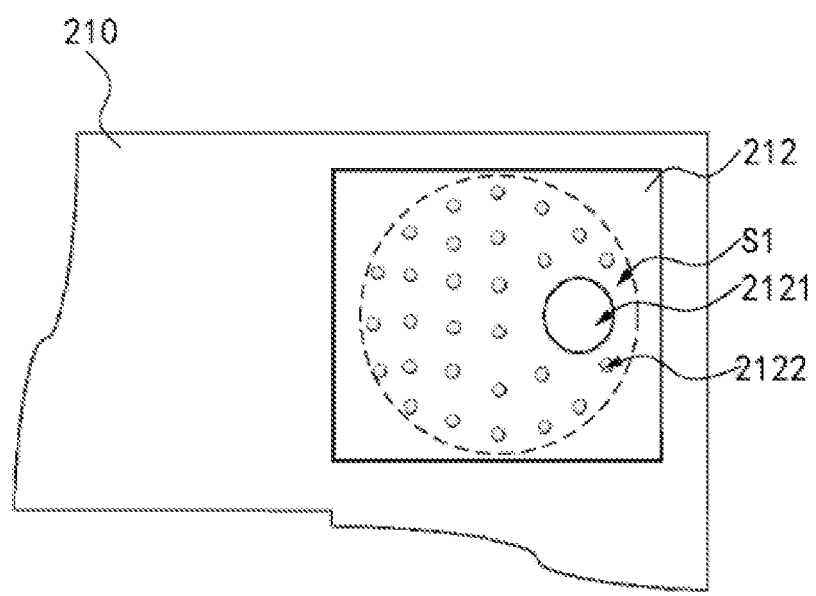
FIG. 4 shows schematically an enlarged view of the mask frame illustrated in FIG. 3.
Figure 5:
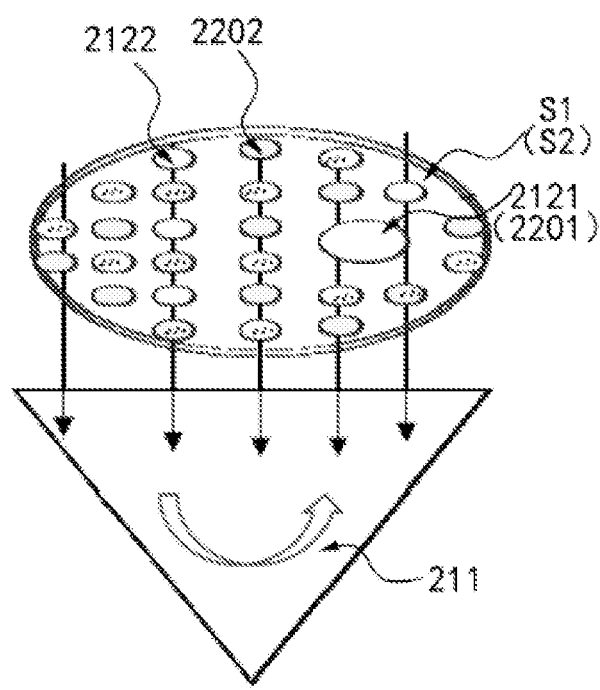
FIG. 5 shows a schematic diagram illustrating the air flow in the mask frame assembly illustrated in FIG. 3.
Figure 6:
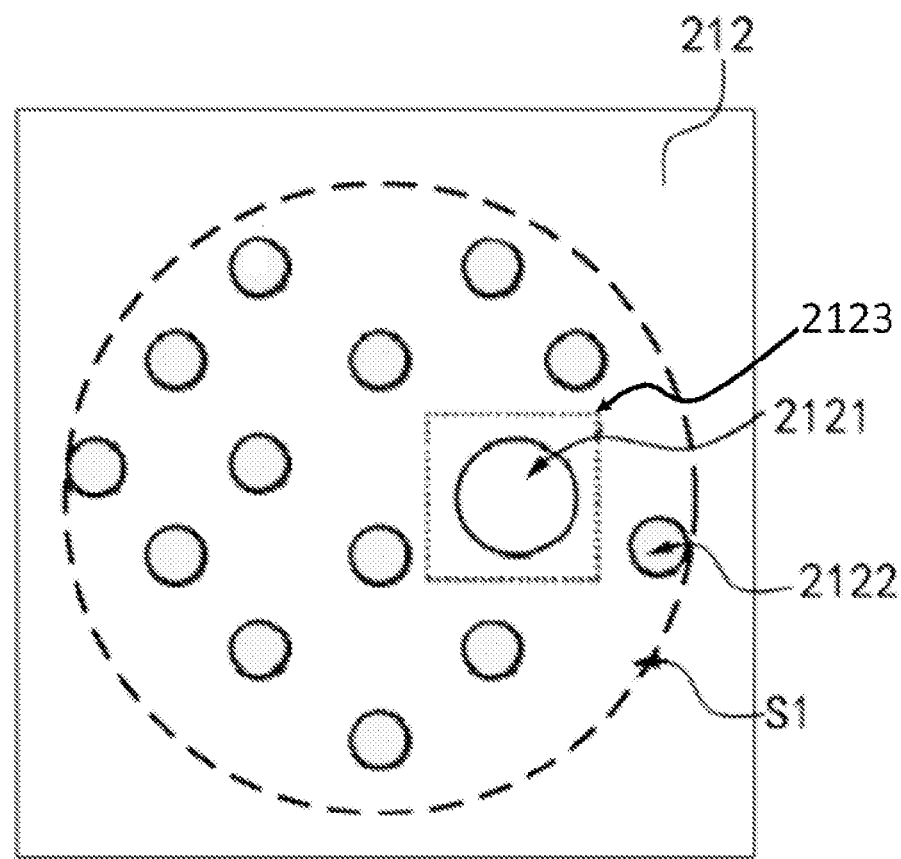
FIG. 6 shows schematically a cover plate in the mask frame illustrated in FIG. 3.
Figure 7:
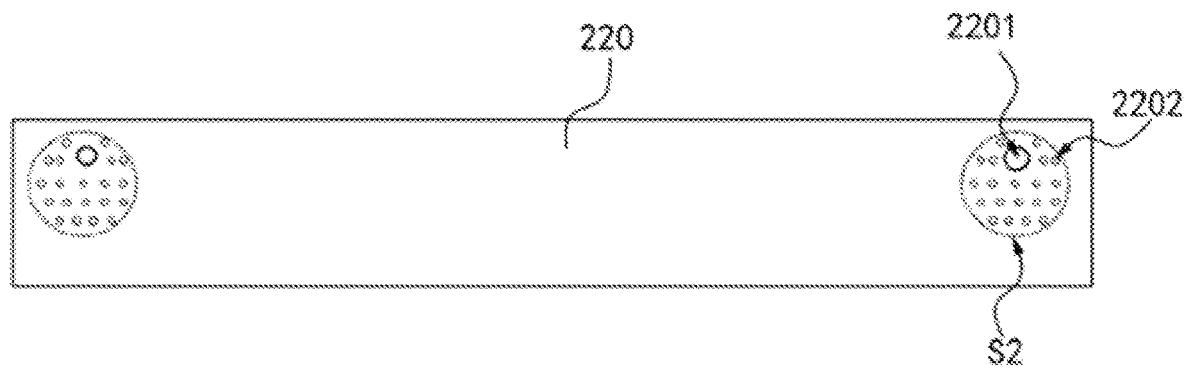
FIG. 7 shows schematically a top view of the alignment mask in the mask frame assembly illustrated in FIG. 2.
Figure 8:
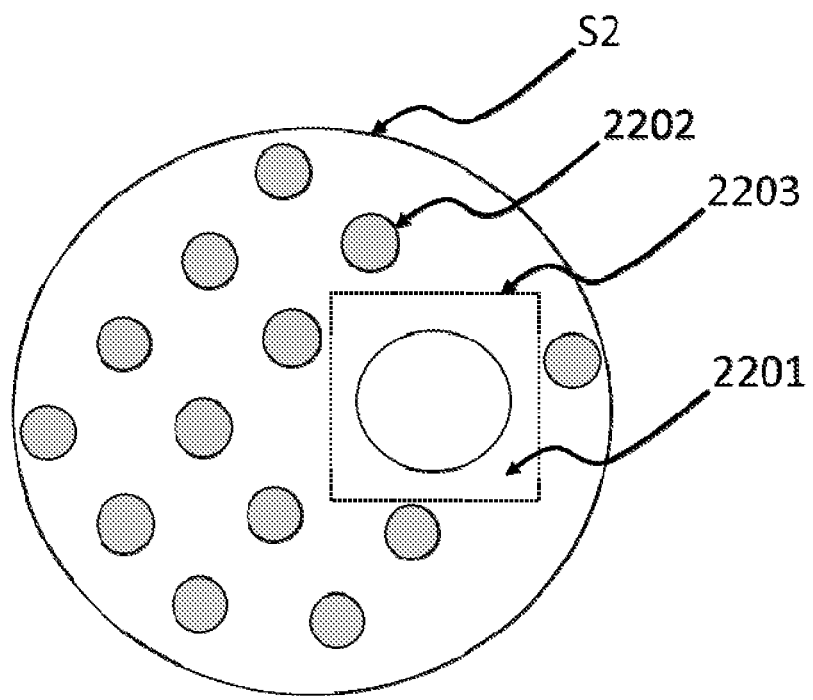
FIG. 8 shows schematically a second via hole area S2 in the alignment mask according to an embodiment of the present disclosure.
Figure 9:
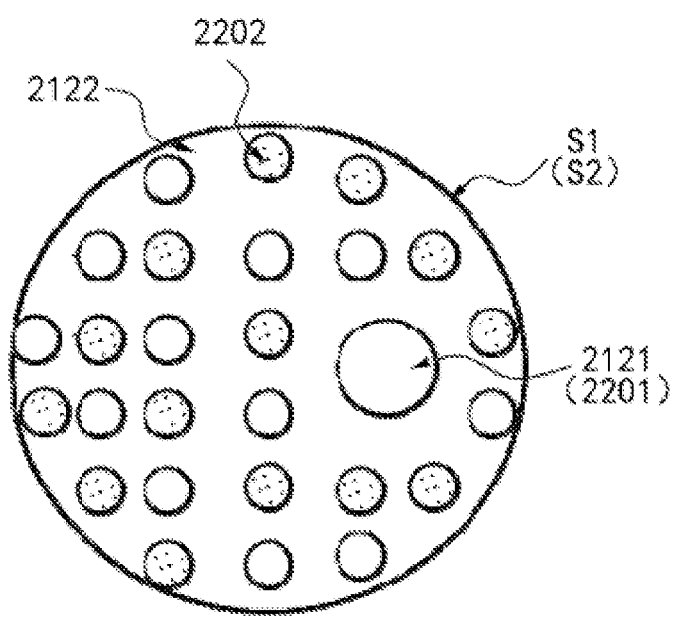
FIG. 9 shows schematically the mask frame assembly illustrated in FIG. 2, in which openings are formed by overlapping the first via hole area with the second via hole area according to an embodiment of the present disclosure.
Figure 10:
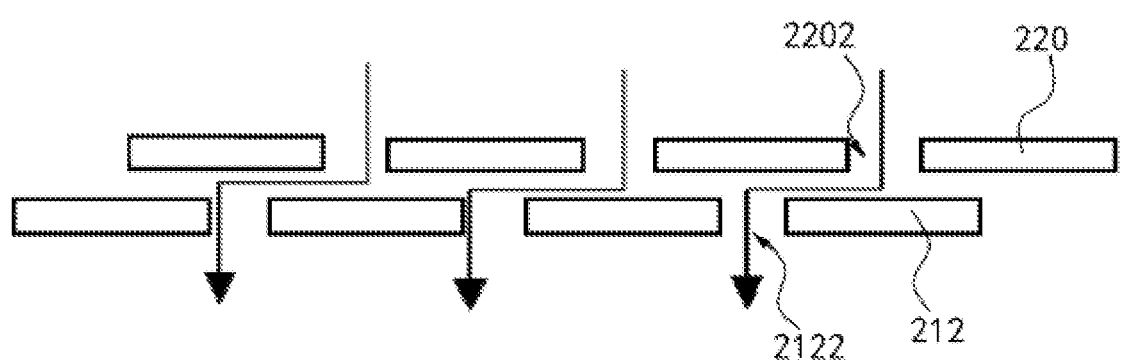
FIG. 10 shows schematically a cross-sectional view of FIG. 9.

The descriptions below refer to FIGS. 3 to 10. FIG. 3 shows schematically a top view of the mask frame 210 in the mask frame assembly illustrated in FIG. 2. FIG. 4 shows schematically an enlarged view of the mask frame 210 illustrated in FIG. 3. FIG. 5 shows a schematic diagram illustrating the air flow in the mask frame 210 illustrated in FIG. 3. FIG. 6 shows schematically a cover plate 212 in the mask frame 210 illustrated in FIG. 3, including a first via hole area S1. FIG. 7 shows schematically a top view of the alignment mask 220 in the mask frame assembly illustrated in FIG. 2. FIG. 8 shows schematically a second via hole area S2 in the alignment mask 220 according to an embodiment of the present disclosure. FIG. 9 shows schematically the mask frame assembly illustrated in FIG. 2, in which an open hole is formed by overlapping the first via hole area S1 with the second via hole area S2 according to an embodiment of the present disclosure. FIG. 10 shows schematically a cross-sectional view of FIG. 9.

As shown in FIGS. 2 and 3, the mask frame 210 may be shaped into a quadrangle frame. The mask frame 210 comprises at least one alignment mark 211 formed in the surface of the mask frame 210. The alignment mark may be a blind hole 211. The blind hole extends to a predetermined depth of the mask frame without breaking through to the other side of the mask frame 210. The blind hole 211 may be configured to have a tapered bottom. In some embodiments, the blind hole 211 may be configured to have a conical shape, for example, as shown in FIG. 2. In some embodiments, the blind hole 211 may be formed in each of the four corners of the mask frame 210. The positions of the at least one blind hole 211 on the mask frame 210 are not particularly limited, and a person of ordinary skill in the art would understand that the at least one blind hole 211 may be arranged on the mask frame 210 as appropriate according to need and/or specific implementations.

As shown in FIGS. 2 to 6, a cover plate 212 is provided over the opening of the blind hole 211. The cover plate 212 is provided over the opening of the blind hole 211. The cover plate 212 does not completely close the opening of the blind hole 211 due to the presence of the first alignment hole 2121 and the plurality of first auxiliary through-holes 2122, as described below. A surface of the cover plate 212 is substantially planar with interface between the mask frame 210 and the alignment mask 220, for example, as shown in FIG. 2. In other words, when the alignment mask 220 is secured to the surface of the mask frame 210, the cover plate 212 is in close, tight contact with the alignment mask 220, for example, as shown in FIG. 2. In some embodiments, the blind hole 211 may be formed with a stepped edge, for example, as shown in FIG. 2. In some embodiments, the blind hole 211 may be formed with a beveled edge. The stepped edge has a bottom face that is substantially perpendicular to the inner wall of the blind hole 211, and a side face connected to the bottom surface that is substantially parallel to the inner wall of the blind hole 211. The cover plate 212 may be seated against the stepped edge of the blind hole 211. More particularly, the cover plate 212 is seated on the bottom face of the stepped edge, for example, as shown in FIG. 2, so that the cover plate 212 becomes anchored when the alignment mask 220 is secured to the mask frame 210.

As shown in FIGS. 4 to 6, the cover plate 212 is formed with a first alignment through-hole 2121 and a plurality of first auxiliary through-holes 2122. The first via hole area S1 is the area on the cover plate 212 in which the first alignment through-hole 2121 and the plurality of first auxiliary through-holes 2122 are provided, for example, as shown in FIGS. 4 to 6. The first vial hole area S1 of the blind hole 211 is the portion of the opening of the blind hole 211 that corresponds to the first via hole area S1 on the cover plate 212. The cavity of the blind hole 211 is connected to the outside via the first alignment through-hole 2121 and the plurality of first auxiliary through-holes 2122, for example, as shown in FIG. 2.

FIG. 7 shows schematically a top view of the alignment mask 220 in the mask frame assembly illustrated in FIG. 2.

As shown in FIG. 7, the alignment mask 220 may be shaped into a quadrangle frame. At least one second alignment through-hole 2201 is formed in the alignment mask 220. When the alignment mask 220 is secured to the mask frame 210, the position of each second alignment through-hole 2201 corresponds, or is aligned with, the position of the first alignment through-hole 2121 on the cover plate 212 and the blind hole 211 on the mask frame 210, for example, as shown in FIG. 2.

In some embodiments, the alignment mask 220 is formed in the shape of a long strip, for example, as shown in FIG. 7. An alignment through-hole is provided at each end of the alignment mask 220 in the longitudinal direction. More particularly, as shown in FIG. 7, a second alignment through-hole 2201 may be provided at each longitudinal end of the alignment mask 220. When the alignment mask 220 is secured to the mask frame 210, the position of each second alignment through-hole 2201 corresponds, or is aligned with, the blind hole 211 on the mask frame 210. It is understood that the arrangements of the second alignment through-holes 2201 on the alignment mask 220 are not limited to the longitudinally opposite ends of the alignment mask 220. The second alignment through-holes 2201 may be arranged in any appropriate manner known to a person of ordinary skill in the art, for example, depending on the specific configurations of the alignment mask 220 and/or the mask frame 210.

As shown in FIGS. 7 and 8, the area of the alignment mask 220 that corresponds to the opening of the blind hole 211 defines the second via hole area S2. The second alignment through-hole 2201 and a plurality of second auxiliary through-holes 2202 are provided in the second via hole area S2. The regions in the second via hole area S2 between the second alignment through-hole 2201 and the plurality of second auxiliary through-holes 2202 are not formed with any openings. In the embodiments illustrated in FIGS. 7 and 8, the alignment mask 220 is formed with two second via hole areas S2, each corresponding to one of the blind holes 221 in the mask frame 210. Each second via hole area S2 is provided with the second alignment through-hole 2201 and the plurality of second auxiliary through-holes 2202.

FIG. 9 shows schematically the mask frame assembly illustrated in FIG. 2, in which openings are formed by overlapping the first via hole area with the second via hole area according to an embodiment of the present disclosure.

As shown in FIG. 9, the first via hole area S1 and the second via hole area S2 are configured so that when the alignment mask 220 is secured to the mask frame 210, the first via hole area S1 and the second via hole area S2 are aligned. More particularly, the first alignment through-hole 2121 in the first via hole area S1 is aligned with the second alignment through-hole 2201 in the second via hole area S2. In at least some embodiments, an orthographic projection of the second alignment through-hole 2201 onto an imaginary plane parallel to a surface of the frame facing the alignment mask 220 is completely within an orthographic projection of the first alignment through-hole 2121 onto the imaginary plane.

Each of the plurality of first auxiliary through-holes 2122 is staggered from the plurality of second auxiliary through-holes 2202. That is, the orthographic projection of each of the plurality of second auxiliary through-holes 2202 on the cover plate 212 does not overlap entirely with any of the plurality of first auxiliary through-holes 2122. At least a portion of the plurality of second auxiliary through-holes 2202 overlap partially with a corresponding portion of the plurality of first auxiliary through-holes 2122. None of the second auxiliary through-holes 2202 overlap entirely with any of the first auxiliary through-holes 2122. In at least some embodiments, the plurality of first auxiliary through-holes 2122 do not overlap with any of the plurality of second auxiliary through-holes 2202.

FIG. 10 shows schematically a cross-sectional view of FIG. 9.

The present disclosure provides a mask frame assembly that is suitable for use in the production of display devices by evaporation. During alignment, for example, by a couple-charged device (CCD) image sensor, the image sensor emits a light to detect the positions of the mask frame assembly. Light emitted by the image sensor can only reach the blind hole 211 through the passage formed by the overlapping first alignment through-hole 2121 and second alignment through-hole 2201. Light at any other position in the second via hole area S2 is blocked from reaching the blind hole 211, for example, as shown in FIG. 10. In FIG. 10, the arrow represents the light emitted by the image sensor. The features of the present disclosure thus facilitate the alignment process by making it possible to more accurately and precisely align the mask frame assembly.

Further, the first and second auxiliary through-holes 2122, 2202 provide passages for the residual liquids in the blind hole 211 to flow out. The features of the present disclosure thus makes it possible to facilitate the discharge of the residual liquids, and in preventing the accumulation of residual liquids during cleaning, improve the effectiveness of the subsequent step of drying the blind hole 211 by heating or air knife.

In some embodiments, the blind hole 211 includes a first passage 2111 and a second passage 2112, for example, as shown in FIG. 2. The first passage 2111 and the second passage 2112 are connected to each other. In some embodiments, the second passage 2112 opens onto the first passage 2111. The opening of the first passage 2111 is on the surface of the mask frame 210. The first passage 2111 may be columnar. In some embodiments, the first passage 2111 forms a cylinder. The second passage 2112 may be conical.

In embodiments where the first passage 2111 is cylindrical, for example, as shown in FIGS. 4 to 9, the cover plate 212 is configured to be circular, so as to have a shape that corresponds to the opening of the first passage 2111. The first via hole area S1 is substantially circular, and the second via hole area S2, having a shape that is complementary to the first via hole area S1, is also substantially circular. It is understood that the shape of the blind hole 211 is not particularly limited. The blind hole 211 may be configured to have any appropriate shape known to a person of ordinary skill in the art depending on need, and the shapes of the first and second via hole areas S1, S2 may be configured in accordance with the shape of the blind hole 211.

The opening of the blind hole 211 may have a diameter of 5 mm to 7 mm. The depth of the blind hole 211 may be from 2 mm to 4 mm. In some embodiments, the opening of the blind hole 211 has a diameter of 6 mm, and the depth of the blind hole 211 is 3 mm.

The cover plate 212 and the mask frame 210 may be composed of the same material. The material forming the cover plate 212 and the mask frame 210 is not particularly limited, and may be any appropriate material known to a person of ordinary skill in the art, including, but not limited to, an Invar alloy (such as Invar 36).

In some embodiments, the cover plate has a thickness of from 10 μm to 50 μm.

As shown in FIGS. 4 to 6, the first alignment through-hole 2121 is off-centered on the cover plate 212 (and the first via hole area S1). That is, the first alignment through-hole 2121 is not positioned at the center of the cover plate 212 (or the first via hole area S1). The first alignment through-hole 2121 is offset relative to the centerline of the blind hole 211.

The second alignment through-hole 2201 corresponds in position to the first alignment through-hole 2121. As such, the second alignment through-hole 2201 is off-centered in the second via hole area S2 on the alignment mask 220. By configuring the first and second alignment through-holes 2121, 2201 to be off-centered, the present disclosure minimizes reflections from the blind hole 211, and minimizes the reflection of light from the image sensor by the blind hole 211. This can in turn improve the effectiveness of the image sensor's position and alignment detection.

As shown in FIGS. 4 to 6, the opening of the first alignment through-hole 2121 may have a larger diameter than the diameter of the opening of any of the first auxiliary through-holes 2122.

In some embodiments, the opening of the first alignment through-hole 2121 may have a diameter of 0.5 mm to 0.7 mm, and the openings of the first auxiliary through-holes 2122 may each have a diameter of 0.1 mm to 0.5 mm. In some embodiments, the opening of the first alignment through-hole 2121 has a diameter of 0.6 mm.

In the first via hole area S1, the distance between the first alignment through-hole 2121 and the nearest first auxiliary through-hole 2122 is from 0.1 mm to 0.25 mm. The distance may be measured from the edge or circumference of the opening of the first alignment through-hole 2121 to the edge or circumference of the opening of the nearest first auxiliary through-hole 2122. The distance may also be measured by extending a line from the center of the opening of the first alignment through-hole 2121 to the center of the opening of the nearest first auxiliary through-hole 2122, and measuring the distance between the point where the line intersects the edge or circumference of the first alignment through-hole 2121 and the point where the line intersects the edge or circumstance of the first auxiliary through-hole 2122.

In some embodiments, no first auxiliary through-holes 2122 are provided within 0.1 mm to 0.25 mm the first alignment through-hole 2121. This exclusion distance $d_{e1}$ defines a first exclusion area 2123 surrounding the first alignment through-hole 2121, for example, as shown in FIG. 6. The width or diameter of the first exclusion area 2123 including the first alignment through-hole 2121 is substantially equal to the sum of $2d_{e1}$ and the diameter of the opening of the first alignment through-hole 2121. In some embodiments, at least five (5) first auxiliary through-holes 2122 are formed in the first via hole area S1.

As shown in FIGS. 7 and 8, the diameter of the opening of the second through-hole 2201 may be larger than the diameter of the opening of any of the second auxiliary through-holes 2202.

The opening of the second through-hole 2201 may have a diameter of 0.4 mm to 0.6 mm. The openings of the second auxiliary through-holes 2202 may have a diameter of 0.1 mm to 0.5 mm. In some embodiments, the opening of the second through-hole 2201 has a diameter of 0.5 mm.

In the second via hole area S2, the distance between the second alignment through-hole 2201 and the nearest second auxiliary through-hole 2202 is from 0.1 mm to 0.25 mm. The distance may be measured from the edge or circumference of the opening of the second alignment through-hole 2201 to the edge or circumference of the opening of the nearest second auxiliary through-hole 2202. The distance may also be measured by extending a line from the center of the opening of the second alignment through-hole 2201 to the center of the opening of the nearest second auxiliary through-hole 2202, and measuring the distance between the point where the line intersects the edge or circumference of the second alignment through-hole 2201 and the point where the line intersects the edge or circumstance of the second auxiliary through-hole 2202.

In some embodiments, no second auxiliary through-holes 2202 are provided within 0.1 mm to 0.25 mm the second alignment through-hole 2201. This exclusion distance $d_{e2}$ defines a second exclusion area 2203 surrounding the second alignment through-hole 2201, for example, as shown in FIG. 8. The width or diameter of the second exclusion area 2203 including the second alignment through-hole 2201 is substantially equal to the sum of $2d_{e2}$ and the diameter of the opening of the second alignment through-hole 2201. In some embodiments, at least five (5) second auxiliary through-holes 2201 are formed in the second via hole area S2.

As shown in FIG. 2, the opening of the first alignment through-hole 2121 may have a larger diameter than the opening of the second alignment through-hole 2201. In some embodiments, the opening of the first alignment through-hole 2121 may have a diameter of 0.6 mm, and the opening of the second alignment through-hole 2201 may have a diameter of 0.5 mm.

As shown in FIGS. 9 and 10, the first auxiliary through-holes 2122 may have the same size as the second auxiliary through-holes 2202. That is, the diameter of the first auxiliary through-holes 2122 may be the same as the diameter of the second auxiliary through-holes 2202. In some embodiments, the first and second auxiliary through-holes 2122, 2202 may have a diameter of 0.1 mm to 0.5 mm. In some embodiments, the first alignment through-hole 2121 has an opening diameter of 0.6 mm, the second alignment through-hole 2201 an opening diameter of 0.5 mm, and the first and second auxiliary through-holes 2122, 2202 an opening diameter of 0.3 mm.

Figure 11:
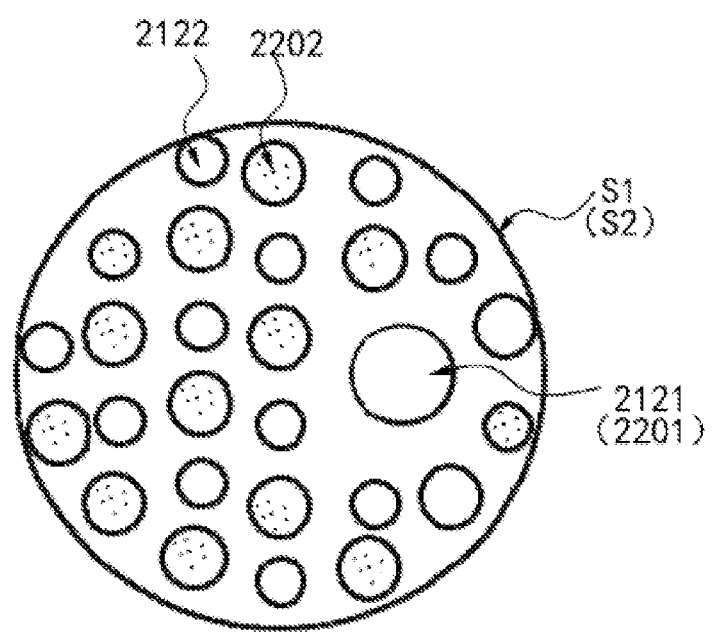
FIG. 11 shows schematically an open hole formed by overlapping the first via hole area with the second via hole area according to another embodiment of the present disclosure.
Figure 12:
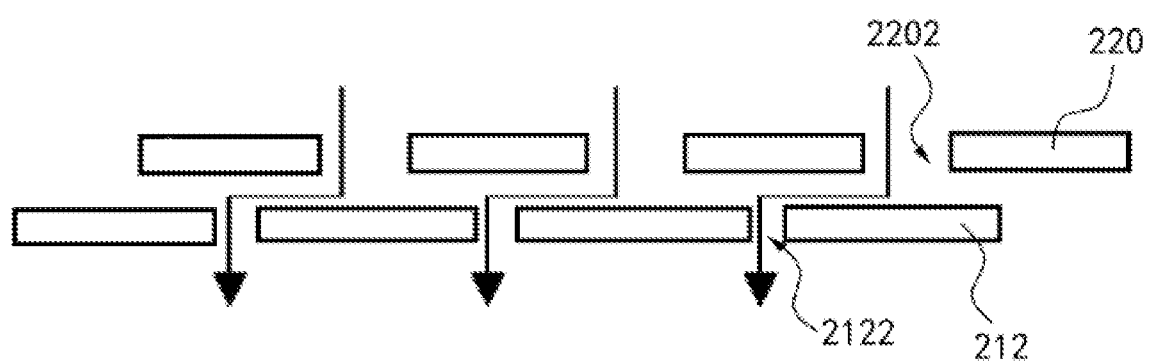
FIG. 12 shows schematically a cross-sectional view of FIG. 11.

FIG. 11 shows schematically an open hole formed by overlapping the first via hole area with the second via hole area according to another embodiment of the present disclosure. FIG. 12 schematically a cross-sectional view of FIG. 11.

In some embodiments, for example, as shown in FIGS. 11 and 12, the opening diameter of the first auxiliary through-holes 2122 is larger than the opening diameter of the second auxiliary through-holes 2202. This configuration can further facilitate the discharge of residual liquids from the blind hole 211, so as to further minimize interferences from residual contaminants on the production and/or quality of the display device.

The opening diameter of the first auxiliary through-holes 2122 may be 1.2 to 3.0 times the opening diameter of the second auxiliary through-holes 2202.

The present disclosure also provides an evaporation apparatus. The evaporation apparatus may comprise the mask frame assembly as described above. The evaporation apparatus may be configured for use in the production of an OLED display panel.

References in the present disclosure made to the term "some embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples. In addition, for a person of ordinary skill in the art, the disclosure relates to the scope of the present disclosure, and the technical scheme is not limited to the specific combination of the technical features, and also should cover other technical schemes which are formed by combining the technical features or the equivalent features of the technical features without departing from the inventive concept. What is more, the terms "first" and "second" are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

The principle and the embodiment of the present disclosures are set forth in the specification. The description of the embodiments of the present disclosure is only used to help understand the embodiments of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. A mask frame assembly, comprising:
a frame, and an alignment mask secured to the frame, wherein the frame comprises at least one alignment mark and a cover plate on the at least one alignment mark, wherein the cover plate comprises a first through-hole and a plurality of first auxiliary through-holes, the first through-hole and the plurality of first auxiliary through-holes defining a first via hole area, and the first through-hole overlapping with the at least one alignment mark, wherein the alignment mask comprises at least one second through-hole and a plurality of second auxiliary through-holes, the at least one second through-hole and the plurality of second auxiliary through-holes defining a second via hole area, the at least one second through-hole being aligned with the at least one first through-hole, wherein the first via hole area overlaps with the second via hole area, and wherein the plurality of first auxiliary through-holes and the plurality of second auxiliary through-holes are staggered relative to each other.

2. The mask frame assembly according to claim 1, wherein the plurality of first auxiliary through-holes do not overlap entirely with any of the plurality of second auxiliary through-holes.

3. The mask frame assembly according to claim 1, wherein the plurality of first auxiliary through-holes do not overlap with any of the plurality of second auxiliary through-holes.

4. The mask frame assembly according to claim 1,
wherein the first through-hole and second through-hole are off-center relative to a center of the alignment mark.

5. The mask frame assembly according to claim 1,
wherein the at least one alignment mark is formed with a stepped edge, and
wherein the cover plate is anchored against the stepped edge, so that a surface of the cover plate is flush with a surface of the frame facing the alignment mask.

6. The mask frame assembly according to claim 1,
wherein the at least one alignment mark is a blind hole,
wherein a diameter of an opening of the blind hole is from 5 mm to 7 mm, and
wherein a depth of the blind hole is from 2 mm to 4 mm.

7. The mask frame assembly according to claim 1,
wherein a diameter of an opening of the first through-hole is from 0.5 mm to 0.7 mm, and
wherein a diameter of an opening of the second through-hole is from 0.4 mm to 0.6 mm.

8. The mask frame assembly according to claim 1,
wherein a diameter of an opening of the first through-hole is either larger or the same as a diameter of an opening of the second through-hole.

9. The mask frame assembly according to claim 1,
wherein an orthographic projection of the second through-hole onto an imaginary plane parallel to a surface of the frame facing the alignment mask is completely within an orthographic projection of the first through-hole onto the imaginary plane.

10. The mask frame assembly according to claim 1,
wherein the first through-hole is larger than any of the plurality of first auxiliary through-holes, and
wherein the second through-hole is larger than any of the plurality of second auxiliary through-holes.

11. The mask frame assembly according to claim 10,
wherein a diameter of an opening of each of the plurality of first auxiliary through-holes and the plurality of second auxiliary through-holes is from 0.1 mm to 0.5 mm.

12. The mask frame assembly according to claim 11,
wherein the plurality of first auxiliary through-holes are either larger or of the same size as the plurality of second auxiliary through-holes.

13. The mask frame assembly according to claim 12,
wherein the plurality of first auxiliary through-holes are larger than the plurality of second auxiliary through-holes, and
wherein the diameter of the opening of each of the plurality of first auxiliary through-holes is 1.2 to 3.0 times the diameter of the opening of each of the plurality of second auxiliary through-holes.

14. The mask frame assembly according to claim 1,
wherein a distance between the first through-hole and a nearest first auxiliary through-hole is from 0.1 mm to 0.25 mm, and
wherein a distance between the second through-hole and a nearest second auxiliary through-hole is from 0.1 mm to 0.25 mm.

15. The mask frame assembly according to claim 1, wherein none of the plurality of first auxiliary through-holes are provided within 0.1 mm to 0.25 mm of the first through-hole.

16. The mask frame assembly according to claim 1, wherein none of the plurality of second auxiliary through-holes are provided within 0.1 mm to 0.25 mm of the second through-hole.

17. The mask frame assembly according to claim 1, wherein the cover plate has a thickness of from 10 μm to 50 μm.

18. The mask frame assembly according to claim 1,
wherein the alignment mask is a rectangular strip, and
wherein the at least one second through-hole is provided at a longitudinal end of the rectangular strip.

* * * * *